United States Patent [19]
Bildgen et al.

[11] Patent Number: 5,886,555
[45] Date of Patent: Mar. 23, 1999

[54] PULSE PRODUCTION CIRCUIT

[75] Inventors: Marco Bildgen, Fuveau; Maxime Tessier, Barcelonette, both of France

[73] Assignee: SGS-Thomson Microelectronics S.A., Saint Genis, France

[21] Appl. No.: 828,159

[22] Filed: Mar. 27, 1997

[30] Foreign Application Priority Data

Mar. 29, 1996 [FR] France ................................. 96 04015

[51] Int. Cl.⁶ .................................................. H03K 7/08
[52] U.S. Cl. .......................... 327/175; 327/176; 318/811
[58] Field of Search .................................. 327/172, 175, 327/176, 291; 318/811, 599; 363/41

[56] References Cited

U.S. PATENT DOCUMENTS

| | | | |
|---|---|---|---|
| 4,356,544 | 10/1982 | Ono et al. ............................... | 318/811 |
| 4,603,425 | 7/1986 | Berlinsky et al. ........................ | 375/22 |
| 4,962,976 | 10/1990 | Takahashi et al. ...................... | 318/811 |
| 5,060,179 | 10/1991 | Sharp ..................................... | 364/718 |
| 5,589,805 | 12/1996 | Zuraski et al. .......................... | 318/811 |

FOREIGN PATENT DOCUMENTS

| | | | |
|---|---|---|---|
| 0 283 952 | 9/1988 | European Pat. Off. ....... | H02M 7/529 |
| 0 312 192 | 4/1989 | European Pat. Off. .......... | G06F 1/02 |

OTHER PUBLICATIONS

*French Search Report* from FR 9604015, filed Mar. 29, 1996.

1990 IEEE Industry Applications Society Annual Meeting; vol. 2, Oct. 7, 1990, pp. 997–1004, XP000203419, G. Joos et al.; *A Three Phase Model Reference Adaptive PWM Technique With Improved Features*.

*Primary Examiner*—Tuan P. Lam
*Attorney, Agent, or Firm*—Wolf, Greenfield & Sacks, P.C.

[57] ABSTRACT

To produce pulses in a cyclically repetitive mode while modifying the production frequency, a counter looped on itself is used. The outputs of this counter are connected to the address inputs of a memory. The signals read in the memory represent pulses to be produced. When it is sought to increase the period of reading the totality of the memory gradually, some of the words of this memory are read for a greater period of time. In the invention, words are chosen for which this addressing will be maintained by comparing the reverse of the reading address with a given value and by deciding, as a function of the result of this comparison, whether the word read at this address must be read for a longer duration or not. It is shown that this circuit is very easy to make and requires but few components. The circuit made can be used particularly in the field of the control of three-phase synchronous motors.

19 Claims, 4 Drawing Sheets

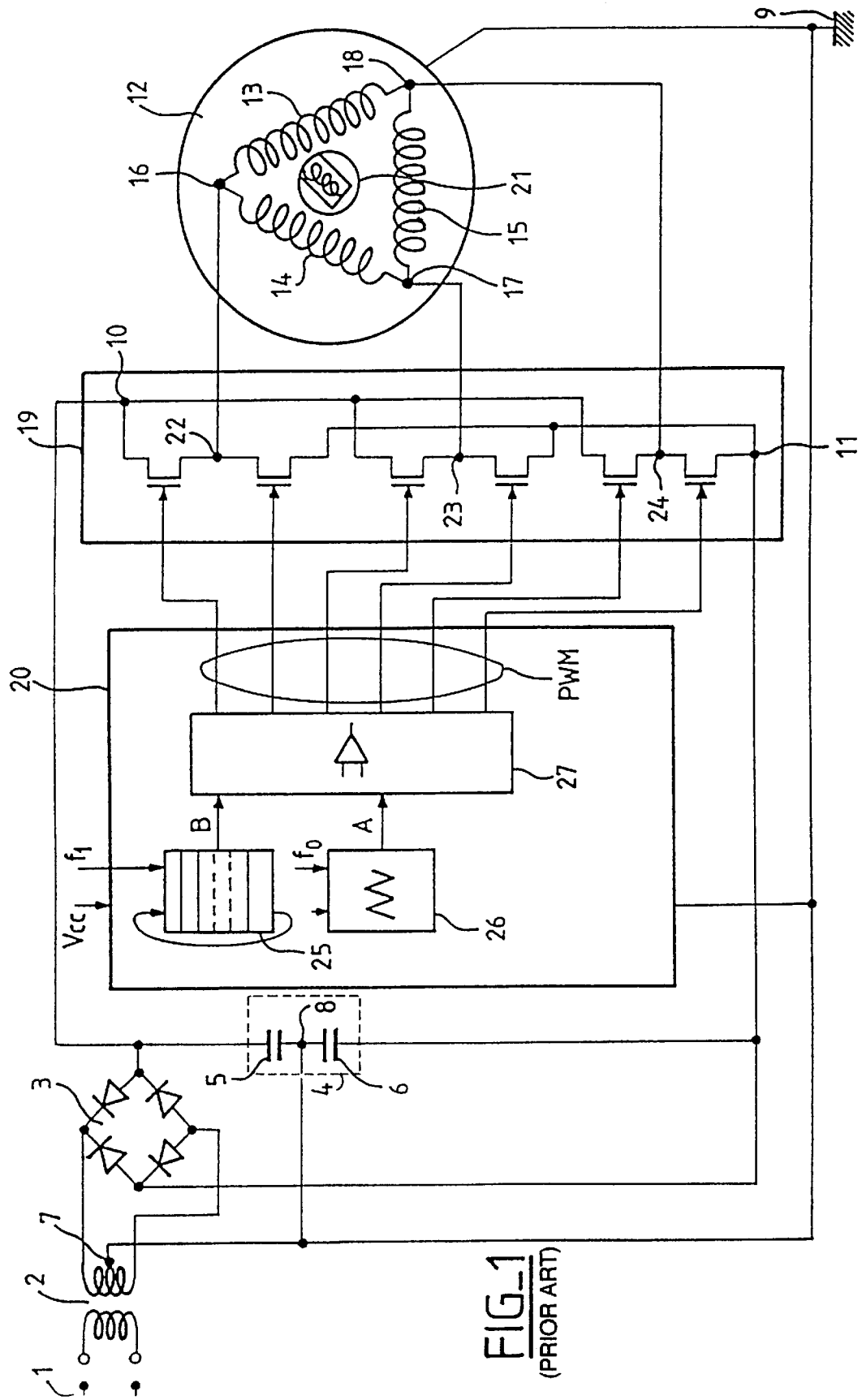
FIG_1 (PRIOR ART)

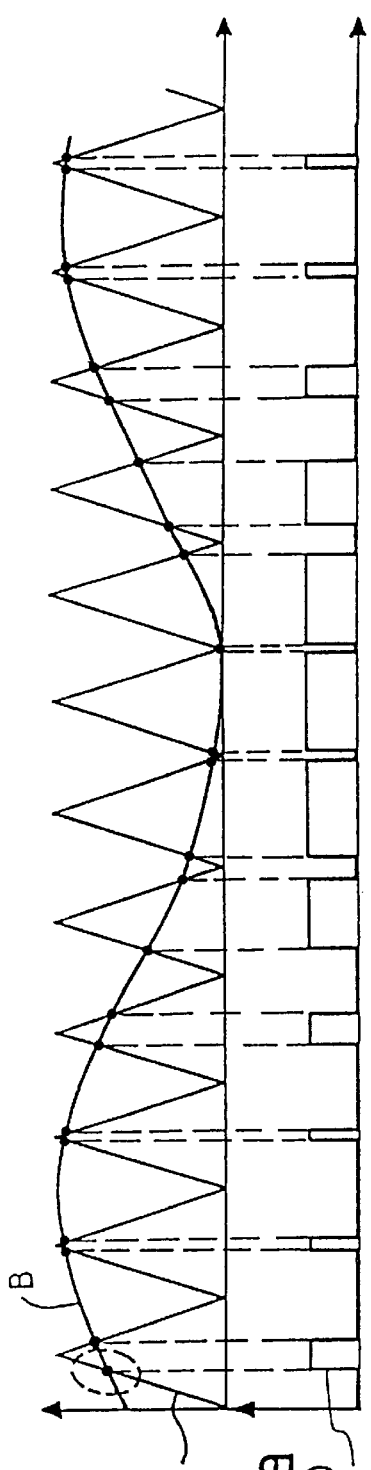
FIG._2a (PRIOR ART)
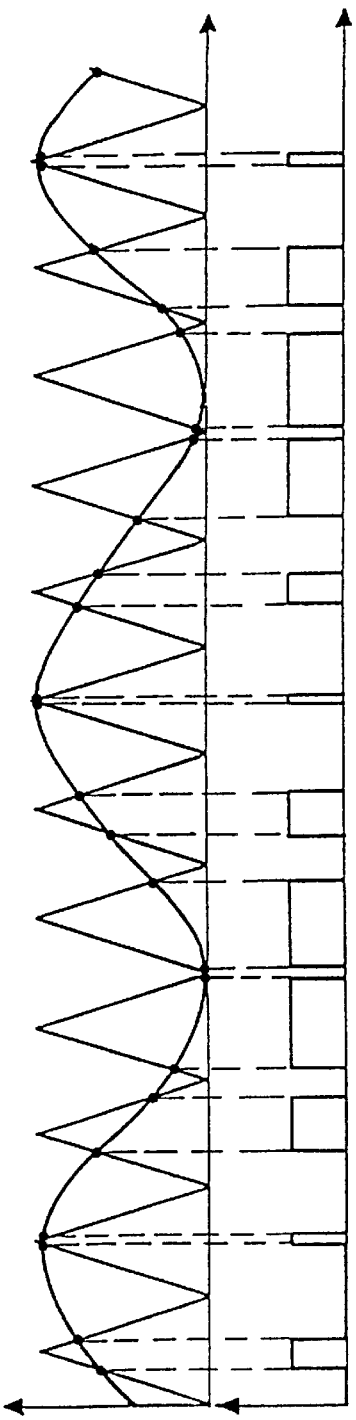
FIG._2b (PRIOR ART)
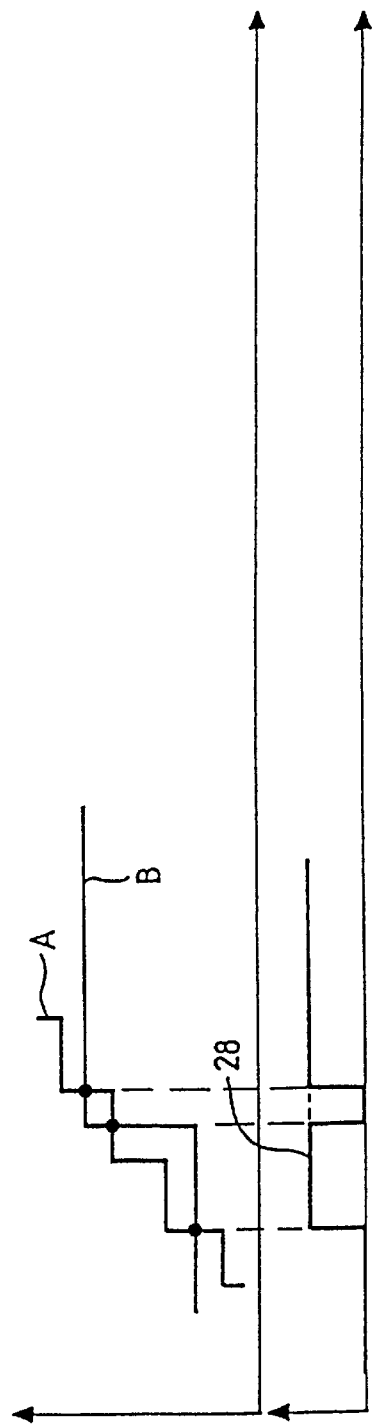
FIG._2c (PRIOR ART)

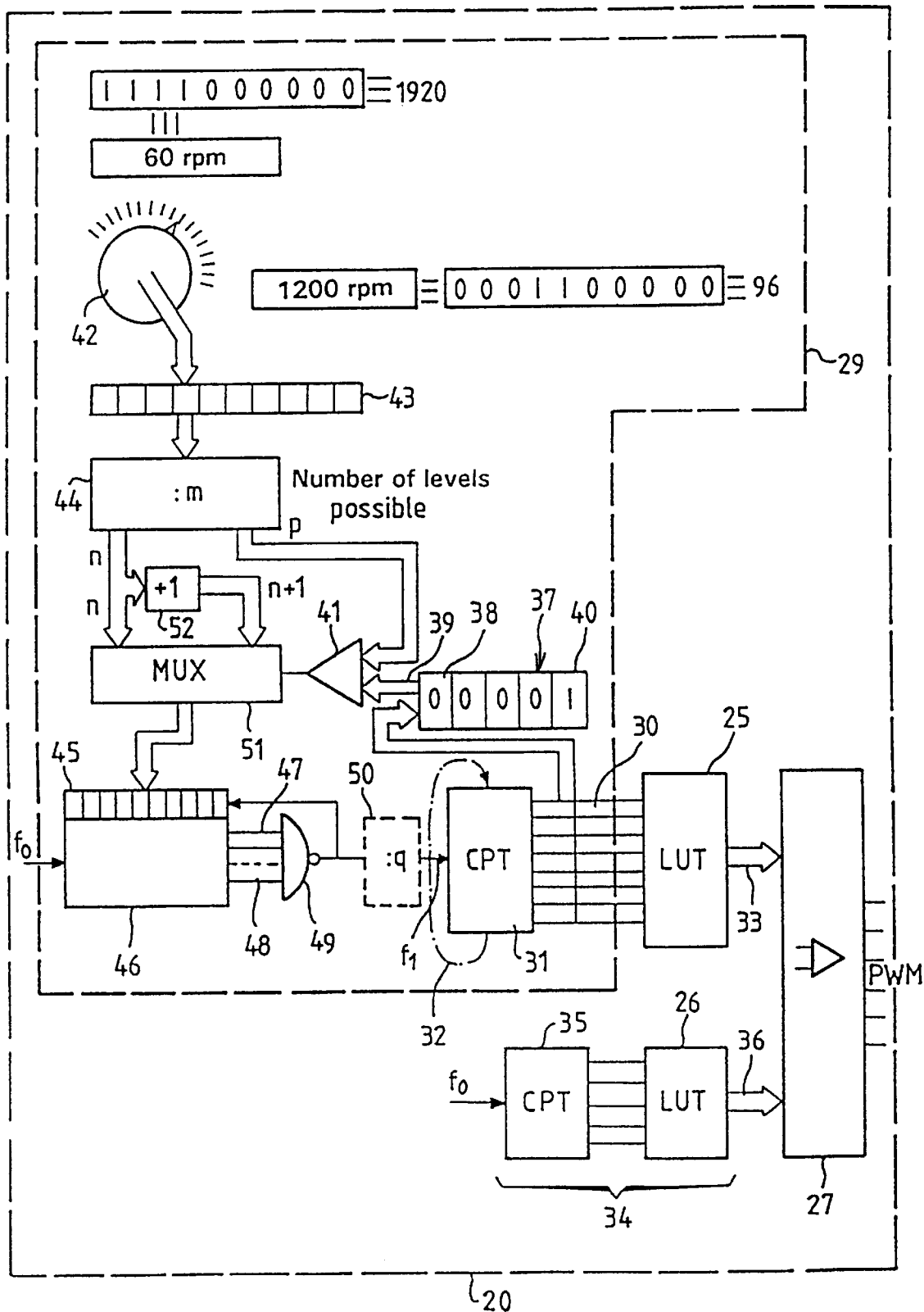

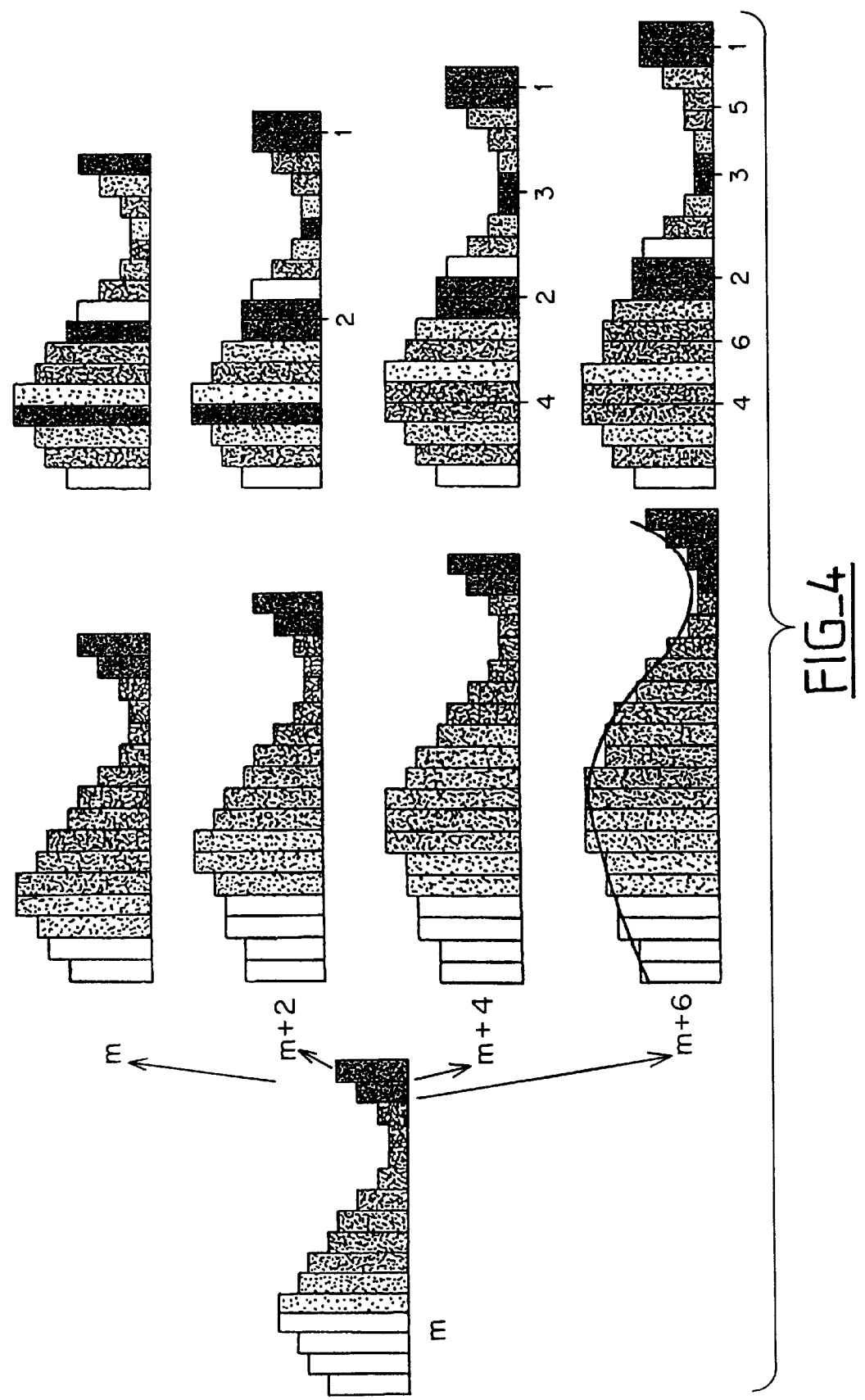
FIG._4

PULSE PRODUCTION CIRCUIT

BACKGROUND OF THE INVENTION

1. Field of the Invention

The present invention relates generally to pulse production circuits and, more particularly, to a circuit for producing width-modulated pulses. The invention can be used especially in the field of electrical motor control and, more particularly, for the control of three-phase asynchronous or synchronous controllable motors.

2. Discussion of the Related Art

In industry, there are many uses for three-phase synchronous or asynchronous motors. For example, such motors are commonly used in pump motors. In domestic applications, household appliances are already beginning to be configured to include three-phase motors. Indeed, these motors have the advantage of not requiring switch-over devices and are therefore not subject to the wearing out of brushes experienced in conventional motors.

However, in domestic applications, as well as sometimes in industry, three-phase motors cannot be used because of the unavailability of a mains electrical current in three-phase form. It has therefore been necessary to devise electronic circuits to produce three-phase electrical current from the rectified single-phase AC mains supply. FIG. 1 is a schematic block diagram of an exemplary circuit that performs such a conversion.

A single-phase AC mains supply 1 lets current into a transformer 2 connected to a diode-based full-wave rectifier bridge 3. The rectifier bridge 3 is parallel connected to the terminals of a capacitive circuit 4 comprising, in the illustrated example, two capacitors 5 and 6 and giving a high DC voltage. In one example, this high DC voltage is in the range of 400 volts. A midpoint 7 of the transformer 2 is connected to a midpoint 8 of the capacitors 5 and 6. If it is sought to economize on one of the capacitors 5 or 6, the midpoint 8 no longer exists and, of course, it is no longer connected to the midpoint 7. The midpoint 7 is furthermore connected to an electrical ground 9 of the system.

The capacitors 5 and 6 are series-connected between a high-voltage node 10 and a low-voltage node 11. In the above example, the node 10 is taken to +200 volts with respect to the ground 9 while the node 11 is at −200 volts.

A three-phase motor 12 has three primary windings 13, 14, 15 series-connected with one another by means of connection terminals 16, 17, 18. The terminals 16, 17, 18 are supplied electrically by a switch-over circuit 19. The circuit 19 is itself controlled by a processing circuit 20. The processing circuit 20, in one example, may be supplied from the rectifier circuit 3 in such a way that this set forms a compact device that can easily be positioned against the motor 12. The motor 12 has a rotor 21 with corresponding coils to rotationally drive mechanical loads.

The circuit 19 schematically has three cells that are parallel-connected to one another between the terminals 10 and 11. Each cell has two series-connected transistors that are connected to each other by a midpoint. The midpoints, respectively 22, 23, 24 of each cell, are connected to the terminals 16, 17, 18. The six transistors of the three cells receive, at their gates, control signals produced by the circuit 20. These control signals are typically pulse-width modulated signals.

FIGS. 2a to 2c give a view, in an example, of particular features of production and use of pulse-width modulated control signals. FIG. 2a shows the principle of this production. A first signal generator is used to produce a saw-toothed signal A. Another signal generator is also used to produce a signal B. In the example, the signal B is a sinusoidal signal. It is ensured that the peak-to-peak amplitude of the signals A and B are the same. The frequencies of the signals A and B are substantially different. In one example, the frequency of the signal A will be in the range of 10 KHz while the frequency of the signal B will be in the range of 200 Hz.

In a comparison circuit 27 (FIG. 1), the value of the signal A is permanently compared with the value of the signal B and a pulse C is provided (FIG. 2a) when the signal A is greater than the signal B. It can clearly be seen in FIG. 2a that the pulses C produced in this way are short-duration signals when the signal B is at its maximum and are long-duration signals when signal B is at its minimum. In this way, a modulation of pulses is produced, referred to as a width modulation.

The circuit 20 includes three circuits of this type, only one of which is illustrated to simplify the Figure. Each of these circuits is therefore capable of producing a signal such as the one shown in FIG. 2a. The circuit 20 also has inverter circuits to produce complementary signals of the three signals thus produced. The six resultant signals are applied to the three cells of the circuit 19. Each signal is applied to a transistor of a cell while the complementary signal of that signal is applied to the other transistor of the same cell. It is known that this mode of action makes it possible, by phase-shifting the signals applied to the different cells with respect to one another, to provide a pulsed supply to the terminals 16 to 18 AC voltages of +200 volts to −200 volts. The phase shift leads to the three-phase supply of the motor 12.

The production of the signals A and B in the circuit 20 is generally done by cyclical readings of tables 25, 26 comprising sets of values that are stored in memory. There may be several sets of such tables. At each cycle period of a clock whose pace is set at a frequency f1 or f0 respectively, a new value of the table is read at an address of a word. The address increases gradually from one cycle period to another. When the reading of a last word of the table is arrived at, a loop is set up with the first word and so on and so forth. In one example, the table 25 used to produce the signal B will have 48 values and the table 26 used to produce the saw-toothed signal A will have 256 values.

In practice, rather than returning to an initial reading address when the final reading address of the table has been reached, it is possible to continue the reading by making the address values decrease so that the table is read backwards until the initial value. Then the reading is started again in the original direction and so on and so forth. Consequently, when the signals are symmetrical, the tables may take up less space.

In the example, the frequency f0 of the reading of the table producing the signal A is in the range of 10 MHz. As a result of this, the frequency of the signal A is also in the range of 10 KHz. Indeed, it is necessary to read 256 values upwards and 256 values downwards, giving about 500 values per period of the signal A. In order that the distribution of the pulses of the signal A during a period of the signal B may have sufficient resolution, the number of the signal A pulses is preferably in the range of 50:48 (which is a multiple of two). This naturally leads to an upper limit frequency for the signal B equal to 200 Hz (10,000/50=200). In view of the fact that it is sought to create signals which are phase shifted by 120°, the table 25 is read at each time with two shifts for the reading, each time, of three values to be compared with the value read in the table 26.

FIG. 2b shows the same elements as FIG. 2a, the only difference being that in FIG. 2b the frequency of the signal B is greater than that of FIG. 2a. The mode of comparison of the signals A and B in the comparator 27 is shown on the bottom of FIG. 2b.

FIG. 2c shows what could happen if the instant of the change of state of the signal B is not synchronized with the instants of the changes of state of the signal A. FIG. 2c gives an enlarged view of the part of FIG. 2a surrounded by dashes. In FIG. 2c, the growth of the signal A is faster than the growth of the signal B owing to the difference in frequency referred to here above. Rather than having only one instant when the signal A becomes greater than the signal B, in certain cases, signal B may, for a very short duration in the range of one or two cycle periods at the frequency f0, be smaller than the signal A. After this period, signal B may then be greater during one more cycle period before again becoming smaller than signal A for a longer duration. The presence of stray pulses such as a pulse 28 shown in FIG. 2c has led those skilled in the art to synchronize the signals with the frequencies f0 and f1 for controlling the reading of the tables 25 and 26.

For three-phase synchronous motors, the only way to change the speed of rotation of the motor is to modify the frequency of the signal B. However, to meet the conditions of synchronization dictated by the disorderly conditions described above and illustrated in FIG. 2c, it has been accepted as a necessity that the signals must be synchronized with the frequency f0 and f1 that enable the production of the signals A and B. In practice, this leads to a situation where f1 is a sub-multiple of f0. This leads to a situation where the modification of the frequency f1 can progress only by operations of division by integers. In the illustrated example, it is thus possible to make f1 vary by 200 Hz to 100 Hz and then 66 Hz and then 50 Hz, etc. However, these frequency jumps are far too great if it is sought to regulate the speed of the motors more precisely. Indeed, if it is arranged that the signal at 200 Hz leads to a motor speed of the order of 1,000 rpm, then the passage to 100 Hz will lead to a modification of this speed into a speed of 500 rpm, without any possibility of obtaining intermediate speeds at 825 rpm, 790 rpm, etc.

One conventional approach has been to duplicate the reading of certain words in the memory table that enables the production of the signal B. By reading the same word twice, for example, the period of the signal B lasts one more cycle period, namely 49 cycle periods instead of 48 cycle periods. This period is modified by about 2%, which is an acceptable adjustment. The problem, however, is to choose those memory words of the memory that must be read several times. Indeed, if the operation is limited to the reading of the first words of the tables several times (namely those words whose address is close to the beginning of the table), a distortion of the equivalent alternating signal produced for the signal B is prompted. This distortion leads to advances and delays of phases of the supply of the windings 13, 14, 15 which are ultimately very poorly supported by the motor 12. This in turn leads to an irregular wearing-out of its rotation bearings. Furthermore, these distortions reverberate as electrical parasites are reinjected into the network 1.

There are known ways, however, of distributing the addresses of the words to be read several times among the possible addresses of the words of the memory 25. However, this distribution implies the use of a microprocessor and of a recorded microprogram whose power, and hence cost, have no relation to the expected cost of the motor 12 and its electronic control circuit. Indeed, for motors for domestic use, the cost of the motor coil and control circuit should be minimal. It is therefore impossible to control a motor of this kind with a microprocessor-based circuit whose cost is significant.

SUMMARY OF THE INVENTION

An object of the invention therefore is a circuit for the production of pulses, especially width-modulated pulses comprising: a memory containing words located at addresses that are read at cyclically-repeated instants to form a first digital signal generator; a processing circuit connected to the memory to produce the pulses; and an address generator configured to prepare address signals, including, an address inverter circuit to invert addresses of words read in the memory, a comparator connected to the inverter circuit to compare the inverted addresses with a predetermined value and produce a comparison signal, and a distributor circuit for the delivery, as a function of the comparison signal, of a signal for the holding of an address prepared during an instant following a given instant.

In one aspect of the invention, the circuit further comprises a second digital signal generator, wherein the processing circuit comprises a comparator to compare the digital signals produced at a given instant by the first and second generator of digital signals, and a logic circuit for the production of the pulses.

The distributor circuit may comprise an address counter and a multiplexer controlled by the comparison signal and receiving a first and a second instruction signal to transmit these instruction signals to this address counter. In one embodiment, the address counter comprises a first reversible counter receiving a clock signal at a countdown input, the signal delivered by the multiplexer at a precharging input, and delivering a time-modulated signal as a function of the comparison signal. In another embodiment of the invention, the address counter also comprises a second counter mounted in cyclical counting mode downline from the first counter, receiving at input the output signal of the first counter and delivering at output the addresses of the address generator. The address counter further comprises: a divider circuit interposed between the first and second counter.

In another aspect of the invention a pulse generator is disclosed. The pulse generator comprises a first digital signal generator including, a memory containing data located at addresses accessible by address signals, the memory generating first digital signals representing the data in response the address signals; an address generator for generating the address signals, including, an address inverter to invert the addresses represented by the addresses signals generated by the address generator, a first comparator connected to the address inverter to compare the inverted addresses with a predetermined value and produce a comparison signal, and a distributor, responsive to the comparison signal, for increasing a duration during which the address signals are held at a value just produced, the address signals representing a held memory address; a second digital signal generator for generating second digital signals; and a processor connected to the first and second digital signal generators to produce pulses in response to the first and second digital signals. Preferably, the pulse generator generates width-modulated pulses.

In another aspect of the invention a variable frequency generator is disclosed. The variable frequency generator comprises a memory containing data located at addresses accessible by address signals, the memory generating first digital signals representing the data in response the address signals; means for generating the address signals, including, an address inversion means for inverting the addresses represented by the addresses signals generated by the address generating means, comparison means, connected to the address inversion means, for comparing the inverted addresses with a predetermined value and produce a comparison signal, and distributing means, responsive to the comparison signal, for increasing a duration during which the address signals are held at a value just produced, the address signals representing a held memory address, the distributing means regularly distributing the held memory addresses among the memory addresses.

In another aspect of the invention a method for generating pulses is disclosed. The method comprises the steps of: (a) providing a memory containing data located at addresses accessible by address signals, the memory generating first digital signals representing the data in response the address signals; (b) inverting the addresses represented by the addresses signals; (c) comparing the inverted addresses with a predetermined value and produce a comparison signal; (d) increasing a duration during which the address signals are held at a value just product, the address signals representing a held memory address; and (e) repeating the step (d) for a plurality of regularly distributed memory addresses.

The invention will enable a resolution of this problem of feasibility at lower cost with a control circuit, in practice a simple integrated circuit, having few functions and therefore being particularly inexpensive. The principle of the invention includes noting that the addresses of the words to be read in the table 25 possess low-order bits and high-order bits. As these addresses are produced, the low-order bits oscillate between values 0 and 1 while the high-order bits remain for a long time in one state before switching over, also for a long time into the other state. The idea of the invention then consists in making a reading, only twice, of the memory words for which the reverse of the addresses is below a given number. The term "reverse of the addresses" is understood to mean not the complementary address but the address in which the moments of the high-order bits are the moments of the low-order bits of the initial address and vice versa. In practice, with n-bit addresses, the position of the n bits is reversed. In doing so, this reversed address shall be considered to be a number and by comparing this number with a given threshold, it is certain that the addresses to be read twice will be distributed substantially equally in the positive half-waves and the negative half-waves of the signal B.

BRIEF DESCRIPTION OF THE DRAWINGS

The invention will be understood more clearly from the following description and from the appended figures. These figures are given purely by way of an indication and in no way restrict the scope of the invention. Of these figures:

FIG. 1 is a schematic block diagram of a conventional electrical device that produces three-phase electrical current from a rectified single-phase AC-mains supply;

FIGS. 2a–2c are signal diagrams illustrating conventional pulse-width modulated signals;

FIG. 3 shows a schematic view of one embodiment of the pulse production circuit according to the invention; and FIG. 4 shows the compared modifications of the shape of the signal B according to the prior art on the one hand and according to the invention on the other hand.

DETAILED DESCRIPTION

FIG. 3 shows one embodiment of a pulse production circuit 20 according to the invention. The circuit 20 includes an address generator 29 and a memory 25. The memory 25 has memory words located at addresses. These memory words can be accessed by means of a decoder, not shown, connected to an address bus 30 on which there are conveyed the address signals produced by the generator 29. The generator 29 has a means for the cyclical reading of the same words in the memory 25. This is shown schematically by an address counter 31 of the generator 29 provided with a symbolic loop 32 showing that the counting is resumed as soon as the counter has reached the counting limit. The term "counting limit" is understood to mean also the fact that once the counter 31 has finished counting, it could start counting down and then start counting up again once it has reached the other end.

When the memory 25 receives address signals, its read circuit (not shown) delivers electrical states on a data bus 33 of this memory, these states representing the memory words which were read. These electrical states represent digital signals. The memory 25 thus forms part of a digital signal generator.

The pulse production circuit 20 of the invention also comprises herein, in the preferred example, a second digital generator 34. In the example shown, this second digital signal generator 34 is also constituted with a counter 35 whose outputs are connected to the address inputs of a memory 26. The output of the memory 26 is connected to a data bus 36. The circuit 34 could have other configurations. For example, the circuit 34 could include a periodic analog signal generator followed by an analog-digital converter. The memories 25 and 26 are preferably of the read-only memory type. The memories 25 and 26 enable the transcoding of the address signals, and are preferably of the look-up table (LUT) table type.

The two data buses 33 and 36 are connected to a known type of processing circuit 27 that is capable of producing the pulsed signals C shown in the lower parts of FIGS. 2a and 2b when it receives digital signals B and A on its input buses 33 and 36, respectively.

The essential characteristic of the invention is that the production circuit comprises an address inverter 37 to invert the addresses of the words read in a memory 25. This address inversion circuit may, in a simple case, be a register 37 that is connected to the bus 30 at output of the address counter 31. The register 37 receives, in its cells, the electrical states that are available at output of this counter 31 and represent the address.

The register 37 is referred to as an inverter because it will be read in reverse to the manner in which it is written. For example, a cell 38 is designed to receive a high-order bit of the address signal delivered by the bus 30. It will be read to produce a low-order address signal on a reading bus 39 of the register 37. In the same way, a cell 40 of the register 37, designed to receive a low-order bit of the address signal, will be read as producing a high-order electrical state on the address bus 39. The register 37 is connected by the bus 39 to a comparator 41 that also receives a binary digital value of comparison p.

The comparator 41 is a comparator that compares the binary value of a signal p with the binary value represented by the address signal transmitted by the bus 39. The comparator 41 has a set of comparators to compare corresponding bits and a logic circuit to deliver a state as a function of the highest rank of the bits that are presented to its inputs and are different.

The output of the comparator circuit 41 is connected to a distributor circuit whose role is to increase the duration during which the address delivered by the counter 31 is held at the value just produced. The distributor makes a regular distribution, among the addresses of the words of the memory, of those addresses that must prompt a holding operation of this kind. Consequently, the distributor circuit delivers a holding signal at output of the counter 31 for the holding of the address prepared beforehand during an instant that follows the instant during which this address was prepared. Although the invention has been presented in the context of a use with the production of pulse-width modulated signals, with a comparator that compares the signals produced by the memory 25 with those produced by the memory 26, it can be understood that the invention essentially relates to the production, on the bus 33, of a signal with a given shape, the frequency of which however changes. Thus, a variable frequency generator has been formed.

The distributor circuit will now be described in detail in the context of an exemplary application. Assuming that the motor 12 is the motor of a household washing machine, it will be desired for example, by using a control button 42, to adjust the speed of the rinsing motor of this machine, gradually, between a maximum speed of 1200 rpm and a minimum speed of, for example, 60 rpm. The button 42 is associated with an electronic circuit capable of producing a binary word which, by its value, represents the reverse of the speed value. This electronic circuit would comprise for example a potentiometer whose pointer will be connected to an analog-digital converter circuit. To simplify the explanation, it will be assumed that the digital signal encoded on 10 bits to represent 1200 rpm is equivalent to 96 in binary mode. For the minimum value of 60 rpm, it will be assumed that the binary signal produced is equivalent to 1920 in binary mode.

This signal is loaded by the electronic circuit of the control button 42 into a register 43. What is put into the register 43 may also come from an instruction present in a negative feedback loop regulating the speed of the motor. The contents of this register 43 are then divided by a divider 44 by m. The number m represents the number of memory words of the memory 25. In the example, m equals 48. The result of the division by m is a quotient n with a remainder p. The quotient n is loaded into a register 45 for the preloading of a counter 46 which receives, at its counting input, the clock signal at the frequency f0. The counter 46 is actually a reversible counter possessing a setting input to place itself in a predetermined state at the beginning of the countdown. The setting input receives the contents of the register 45 at the beginning of the countdown. The greater the contents of the register 45, the slower the speed with which the reversible counter 46 will reach its state zero 00 . . . 0 (where the countdown is begun). This is why the electronic circuit associated with the button 42 reverses the binary values with respect to the values displayed in rpm. The outputs 47 to 48 of the counter 46 are connected to a NAND gate 49 whose output temporarily goes through the state 1 when the counter 46 reaches the state 00 . . . 0. At this time, a signal available at output of the gate 49 is used to reinitialize the countdown of the counter 46. The frequency of appearance of the pulses at the output of the gate 49 is all the greater, for a given frequency f0, as the binary value loaded into the register 45 is low (and therefore the number of revolutions per minute is high). The pulses available at output of the gate 49 are divided as the case may be by a divider 50 performing a division by a value q. The signal delivered by the divider 50 oscillates at a frequency f1. In one example, q is equal to about 1000. This division is not absolutely indispensable. It is quite simply connected to the value of the frequency f0 compared with the resultant value f1. By choosing a lower value f0, the divider 50 may be avoided. The pulses delivered by the divider 50 are introduced into the counting input of the counter 31 which carries out the counting and addressing of the memory 25 referred to above.

In the event of maximum speed, 1200 rpm, where the binary number of the register 43 is equal to 96 and where the value of m is equal to 48 because there are 48 values recorded in the memory 25 with 48 address words, the division by the divider 44 gives a quotient n equal to two and a remainder p equal to zero. The addressing therefore occurs as indicated above. On the contrary, if the position of the button 42 is modified very slightly, the value loaded into the register 43 will increase (in terms of binary equivalent from 96 to 1920). If the value goes to 97, the remainder p will be equal to 1. It will furthermore be noted that p is always smaller than m. The value p actually represents the number of memory words of the memory 25 that must be read or used during an additional cycle period to extend the period of the signal B as a function of need.

As indicated above, p represents the number of memory words that must be read most frequently, but it could be used to obtain direct knowledge of those memory words of the memory 25 that must be read to conduct a signal B that is not distorted, at least not excessively distorted. Since the signal p is equal to 1, only the address 000 . . . 0 let through by the counter 31 is below p. Hence, the reverse of this address (which in this particular case is an address located at the same position as itself) is less than 1. This reverse address compared with the value p=1 by the comparator 41 leads to the designation of this reverse address 000 . . . 0 for a word that must be used for a longer period of time.

In this case, the comparator 41 sends out a control signal that acts on a multiplexer 51. The multiplexer 51 can be used, depending on the value of its control signal, for the loading of the register 45 with the value n or with the value n+1. The value n corresponds to direct transmission from the output of the divider 44 while the value n+1 is obtained by an adder 52 that adds the value +1 to the value read at output of the divider 44. For the value 96 referred to above and with m equal to 48, n was equal to 2: in binary mode this is written as 10. The value n+1 will be written then as 11 in binary mode.

In other words, when the counting starts, when the initial address put through by the counter 31 is equal to 00 . . . 0, the comparator 41 delivers a signal such that the value 11 is loaded into the register 45. In this case, it is necessary to have one additional clock cycle f0 before the gate 49 delivers an additional pulse. In view of the divider by q, for the q−1 following pulses delivered by the gate 49, they are delivered only at the end of 3 (11 in binary mode) cycle times of f0 instead of 2 (10) cycle times. If the divider by q is not present, it is the next word of the memory 25 that will be used for one additional cycle time. The distribution will nevertheless be regular.

At the following address which is 00 . . . 10, the comparator 41 no longer detects the fact that the reverse of the address is below p. Indeed, it is then a very large number since, in its high-order bits, this address reverse number possesses a bit at 1. In this case, the multiplexer 51 transmits the state n to the register 45. Until the counter 31 has finished its turn, the address values that it delivers will be held two q times the cycle time of f0, the first address having for its part being held three q times.

If, instead of 96, 98 is read, the remainder of the division by the divider 44 will be p=2. In this case, as in the previous case, the address 00 . . . 0 will be held three q times and the address 000 . . . 1 will be held only two q times. The other address which will be held three q times the cycle time is the address whose most significant bit is equal to 1, all the other bits being equal to zero. It is this representation that is shown in FIG. 3 where the cell 40 has a bit at 1, the others being bits at 0. Continuing in this way according to the value of p, the comparator 41 chooses those words that must be used for a supplementary cycle time.

With a choice of 64 values for the memory 25, and with m=64, it will be enough to make a counter 31 with 6 bits and the process would take place as described above. However, for reasons of memory size, the value chosen is m=48 which is not an integer power of two. It is realized that it is then necessary to eliminate certain results of counting delivered by the counter 31. A quarter of them are eliminated so as to go from 64 to 48. An elimination of this kind may be obtained by detecting the occurrences of the state 10 on the low-order bits of the counter 31. These occurrences are detected by two Exclusive-OR gates each receiving one of the low-order bits and the value 1 or 0 respectively. These two Exclusive-OR gates are connected to an AND gate that ultimately goes to one when such an occurrence is detected. A fast complementary counting by the counter 31 is then prompted so that it goes from the state 10 (low-order) to the state 00 (low-order) without having passed through the state 11. Circuits performing this type of counting are considered to be known in the art. The access decoder providing access to the memory 25 is furthermore modified accordingly. Low-order bits 11 do not permit any addressing, and the corresponding circuits are eliminated.

FIG. 4 gives a comparative view of the deformation given to the signal B respectively by a prior art circuit and a circuit of the present invention. Four situations are shown wherein a signal B changing during m cycle periods is likely to have its frequency drop in order to be distributed over m+2, m+4, m+6 cycle periods etc. In the prior art, where the operation amounts to making a direct comparison of the addresses read at the value p, it becomes necessary to hold the signal delivered by the memory 25 during the pulses occurring at the start of the reading 25. It will be noted that the term "start of the reading of the memory" is applied to any value of the memory 25 characterized by its address 00 . . . 0 in the table 25. The bottom of FIG. 4, at the center, shows that for m+6, a very great distortion appears between the positive half-wave whose rising part is very slow and the negative half-wave whose rising part is steep. The signal is most deformed when p is in the range of m/2.

On the contrary, in the invention, with the system described, it can be seen that, depending on the value of p ranging from 2 to 6, the addresses of the memory words read in the memory 25 are distributed in a naturally harmonious way such that the positive half-wave remains substantially at the same duration as the negative half-wave and that the deformation given to one is compensated for by a symmetrical deformation given to the other.

With the circuit of the invention, there is therefore obtained a shape kept within quite acceptable tolerances, this being achieved at the cost of a very simple additional circuit that in practice comprises only the address inverter circuit 37 (only one register), the comparator 41 and the multiplexer 51. Indeed, the dividers 44, the counters 46 and 31 are naturally already available in many control circuits. The modification provided here is therefore very simple and the cost involved is minimal.

Having thus described the particular embodiments of the invention, various alterations, modifications, and improvements will readily occur to those skilled in the art. Accordingly, the foregoing description is by way of example only and is not intended as limiting. The invention is limited only as defined in the following claims and equivalents thereto.

What is claimed is:

1. A circuit for the production of pulses, comprising:
    a memory containing words located at addresses accessible by address signals that are read at cyclically-repeated instants to generate digital signals;
    a processing circuit connected to said memory to produce the pulses; and
    an address generator configured to prepare the address signals, including,
        an address inverter circuit to invert addresses of words read in said memory represented by said address signals,
        a comparator, operatively coupled to said inverter circuit, to compare said inverted addresses with a predetermined value and to thereby produce a comparison signal, and
        a distributor circuit for the delivery, as a function of said comparison signal, of said address signals so as to hold an address prepared during an instant following a given instant.

2. The circuit according to claim 1,
    wherein the circuit further comprises:
        a digital signal generator to generate second digital signals,
    wherein said processing circuit comprises,
        a comparator to compare said first and second digital signals produced at a given instant, and
        a logic circuit coupled to said comparator for producing the pulses.

3. The circuit according to claim 1, wherein said distributor circuit comprises:
    a counter; and
    a multiplexer, responsive to said comparison signal, for transmitting a first and a second instruction signal to said counter.

4. The circuit according to claim 2, wherein said distributor circuit comprises:
    an address counter; and
    a multiplexer, responsive to said comparison signal, for transmitting one of a first and a second instruction signal to said address counter.

5. The circuit according to claim 3, wherein said counter comprises:
    a reversible counter receiving a clock signal at a countdown input and said transmitted first and second instruction signals at a precharging input, and delivering a time-modulated signal as a function of the comparison signal.

6. The circuit according to claim 5, wherein said counter further comprises:
    an address counter mounted in cyclical counting mode configured to cyclically generate said address signals of said address generator in response to said time-modulated signal.

7. The circuit according to claim 6, wherein said counter further comprises:
    a divider circuit interposed between said reversible counter and said address counter.

8. The circuit according to claim 7, wherein said pulses are width-modulated pulses utilized for machine control.

9. The circuit according to claim 1, wherein said pulses are width-modulated pulses utilized for machine control.

10. A pulse generator comprising:

a first digital signal generator including, a memory containing data located at addresses accessible by address signals, said memory generating first digital signals representing said data in response said address signals;

an address generator for generating said address signals, including, an address inverter to invert said addresses represented by said address signals generated by said address generator, a first comparator connected to said address inverter to compare said inverted addresses with a predetermined value and to produce a comparison signal, and a distributor, responsive to said comparison signal, for increasing a duration during which said address signals are held at a value just produced, said address signals representing a held memory address;

a second digital signal generator for generating second digital signals; and a processor connected to said first and second digital signal generators to produce pulses in response to said first and second digital signals.

11. The pulse generator of claim 10, wherein said pulses are width-modulated pulses.

12. The pulse generator of claim 10, wherein said distributor comprises an address counter for generating said address signals, and wherein said address inverter is a register connected to said address counter to receive said address signals representing said memory addresses, said register configured to read said addresses in a manner reverse to that in which said addresses are written to said memory.

13. The pulse generator of claim 12, wherein said distributor further comprises:

a multiplexer, responsive to said comparison signal, for transmitting a first and a second instruction signal to said address counter.

14. The pulse generator of claim 10, wherein said memory is a look-up-table type memory.

15. The pulse generator of claim 10, wherein said processor comprises:

a second comparator to compare said digital signals produced at a given instant by said first and second signal generators; and a logic circuit operatively coupled to said second comparator for producing pulses corresponding to said comparison made by said second comparator.

16. The pulse generator according to claim 12, wherein the address counter comprises:

a reversible counter receiving a clock signal at a countdown input; a multiplexer, responsive to said comparison signal, for transmitting a first and a second instruction signal to a precharging input, and delivering a time-modulated signal as a function of the comparison signal; and a counter mounted in cyclical counting mode configured to cyclically generate said address signals of said address generator in response to said time-modulated signal.

17. The pulse generator according to claim 16, wherein the pulse generator produces width-modulated pulses for controlling a machine.

18. A method for generating pulses, comprising the steps of:

(a) providing a memory containing data located at addresses accessible by address signals, said memory generating first digital signals representing said data in response said address signals;

(b) inverting said addresses represented by said addresses signals;

(c) comparing said inverted addresses with a predetermined value and produce a comparison signal; and (d) increasing a duration during which said address signals are held at a value just produced, in response to said comparison signal, said address signals representing a held memory address.

19. The method according to claim 18, wherein said pulses are width-modulated pulses.

* * * * *

UNITED STATES PATENT AND TRADEMARK OFFICE
CERTIFICATE OF CORRECTION

PATENT NO. : 5,886,555
DATED : March 23, 1999
INVENTOR(S) : Marco Bildgen and Maxime Teissier It is certified that error appears in the above-identified patent and that said Letters Patent is hereby corrected as shown below:

On the title page, item [73] should read:

[73] Inventors: Marco Bildgen, Fuveau; Maxime Teissier, Barcelonette, both of France Signed and Sealed this Twentieth Day of July, 1999

Attest:

Q. TODD DICKINSON

Attesting Officer

Acting Commissioner of Patents and Trademarks